US006052287A

United States Patent [19]
Palmer et al.

[11] Patent Number: 6,052,287
[45] Date of Patent: Apr. 18, 2000

[54] SILICON BALL GRID ARRAY CHIP CARRIER

[75] Inventors: David W. Palmer, Albuquerque, N.Mex.; Richard A. Gassman, Greensboro, N.C.; Dahwey Chu, Albuquerque, N.Mex.

[73] Assignee: Sandia Corporation, Albuquerque, N.Mex.

[21] Appl. No.: 08/987,276

[22] Filed: Dec. 9, 1997

[51] Int. Cl.$^7$ ...................................................... H05K 7/02
[52] U.S. Cl. ........................... 361/767; 361/760; 361/764; 361/765; 257/774; 257/782; 257/737; 257/738; 174/255; 174/262; 174/266; 228/180.22
[58] Field of Search ..................................... 361/767, 760, 361/764, 771, 765, 772, 820, 777; 257/774, 782, 737, 738, 686, 769, 678, 713, 700, 690, 692; 228/180.22; 211/41.17, 41.18; 174/52.1, 250, 255, 260, 262, 266

[56] References Cited

U.S. PATENT DOCUMENTS

| 5,200,810 | 4/1993 | Wojnarowski | 361/398 |
|---|---|---|---|
| 5,355,283 | 10/1994 | Marrs | 361/760 |
| 5,357,672 | 10/1994 | Newman | 29/830 |
| 5,468,999 | 11/1995 | Lin et al. | 257/784 |
| 5,557,844 | 9/1996 | Bhatt et al. | 29/852 |
| 5,615,477 | 4/1997 | Sweitzer | 29/840 |
| 5,646,828 | 7/1997 | Degani et al. | 361/715 |
| 5,767,447 | 6/1998 | Dudderar et al. | 174/52.4 |
| 5,854,507 | 12/1998 | Miremadi et al. | 257/688 |

*Primary Examiner*—Leo P. Picard
*Assistant Examiner*—David Foster

[57] ABSTRACT

A ball-grid-array integrated circuit (IC) chip carrier formed from a silicon substrate is disclosed. The silicon ball-grid-array chip carrier is of particular use with ICs having peripheral bond pads which can be reconfigured to a ball-grid-array. The use of a semiconductor substrate such as silicon for forming the ball-grid-array chip carrier allows the chip carrier to be fabricated on an IC process line with, at least in part, standard IC processes. Additionally, the silicon chip carrier can include components such as transistors, resistors, capacitors, inductors and sensors to form a "smart" chip carrier which can provide added functionality and testability to one or more ICs mounted on the chip carrier. Types of functionality that can be provided on the "smart" chip carrier include boundary-scan cells, built-in test structures, signal conditioning circuitry, power conditioning circuitry, and a reconfiguration capability. The "smart" chip carrier can also be used to form specialized or application-specific ICs (ASICs) from conventional ICs. Types of sensors that can be included on the silicon ball-grid-array chip carrier include temperature sensors, pressure sensors, stress sensors, inertia or acceleration sensors, and/or chemical sensors. These sensors can be fabricated by IC processes and can include microelectromechanical (MEM) devices.

18 Claims, 3 Drawing Sheets

SILICON BALL GRID ARRAY CHIP CARRIER

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates to the field of high-density interconnect circuits, and more particularly to integrated-circuit (IC) chip carriers for increasing the versatility, effective contact density and efficiency of ICs.

BACKGROUND OF THE INVENTION

The desirability of providing higher density integrated circuits is well established. As a result of this objective, very large scale integration (VLSI) integrated circuits have outgrown the connection capacity of standard chip packaging systems. This is true for both ceramic packages used in high reliability industrial and military applications as well as in the lower cost molded plastic packages for commercial and consumer products.

Attendant to high-density integrated circuits are a number of problems which have not been satisfactorily solved, at least from the perspective of economical utilization of these devices. One problem relates to testing requirements. As the complexity of integrated circuits becomes greater, there is a greater need for testing integrated circuits prior to installation of these devices into electronic assemblies. And there remains the necessity of testing integrated circuits once placed into the assemblies. To accomplish these testing requirements, access to the semiconductor bond pads for providing inputs and outputs (I/OS) to each IC presents an ever increasing problem. Interfacing a complex IC with tester equipment and/or electronic analysis equipment has become highly important since it is desirable to test the functionality of the IC at full speed. It is also desirable to burn in the IC with easy access. Not only are these requirements of existing methods for producing an IC chip (i.e. an IC die) and securing the IC chip to a substrate such as a printed circuit board a continuing problem, but it is becoming increasingly desirable to use multi-chip module packaging. For these multi-chip modules, it becomes nearly imperative for economical reasons that the IC chips be tested and burned in. Allowing complete electrical characterization and full electrical and temperature screening of each IC chip is problematic with current electrical probe and chip assembly operations.

Another problem that occurs in high-density ICs is that the large number of bond pads on the IC chip create signal interference problems. These signal interference problems can be relieved only by decreasing bond pad size which causes further difficulty in the above-described testing requirements.

Another common problem in high-density integrated circuits is heating. Various techniques have been developed for attempting to relieve the heat within the IC device itself such as the use of heat spreaders such as disclosed in U. S. Pat. No. 5,357,672 to Newman. However, heat spreaders or other thermal management techniques are only as effective as the ability to dissipate the heat, not merely from the interior of the IC chip, but also from the surface of the IC package holding the IC chip. Thermal management of high-powered ICs by efficient removal of heat from IC chips is an important objective in the design of ICs.

Another problem that attends high-density ICs is the desire to provide additional signal conditioning techniques such as power conditioning through the use of capacitors, or voltage conversion or voltage pegging; or the use of filters or amplifiers without further increasing the component density in the IC chip. Other functions such as chip-monitoring sensors for temperature, noise, stress, and error rate and reconfiguration switches that allow the turning on and off of inputs and outputs (I/Os) to allow repair from a remote location would also be desirable without further increasing the density of the IC. Moreover, these ancillary functions may not be necessary or desirable in every application in which the IC is ultimately to be used. Under current IC manufacturing techniques, these ancillary functions may force the system designer to resort to a custom IC at large expense. This is necessitated because a supplier of a commercial high-density IC may not wish to increase the cost by providing these ancillary functions on chip for those applications where such functions are not ultimately required. And as the number of transistor gates becomes increasingly greater in ICs, the commercial chip manufacturer is more dependent on large volume orders to amortize the design and fabrication costs, thereby forcing the system designer with a specialized problem to rely on custom IC fabrication.

Simultaneous with the existence of these problems has been the development of IC chip packaging techniques designed to relieve the I/O problem of the chips for which a high connection capacity is required. New techniques such as plastic pin grid array (PPGA) and plastic ball grid array (PBGA) packages or chip carriers have recently come into use. Ball grid array (BGA) ICs allow a high density of external I/O connections to be made as compared to other packaging for ICs having peripheral bond pads.

Most conventional BGA IC packages are large and are of a ceramic and/or laminate construction. In general, a ball grid array IC package comprises a ceramic or laminate substrate (i.e. a non-semiconductor substrate) on which is mounted one or more semiconductor IC dies, with a lower surface of the BGA IC package having formed thereon conductive regions, with a solder ball secured to each conductive region. Each conductive region is connected from the bottom surface of the ceramic or laminate substrate by through-holes or vias, formed in the ceramic or laminate material. The ceramic or laminate substrate can comprise multiple material layers as required for many IC packaging applications.

Generally speaking, these BGA IC packages are large, up to several times thicker than the IC chip, and about two to ten times larger in surface area. Smaller BGA IC packages using ceramic or laminate substrates have also been used, and mounted directly on the IC chip to provide repatterning to accomplish the repositioning of the IC bond pads into a grid array. Of course, patterning directly on the IC is in essence making a more complex IC and does not gain from off-loading a portion of the complexity of the IC onto a chip carrier.

Chip carriers offer the potential for accomplishing the ancillary functions as described above, and to limit the complexity of ICs without fully sacrificing the objective of high-density IC packaging. BGAs on chip carriers have also been used with a patterned plastic film so as to reposition the IC bond pads, providing a low-cost, limited-capability approach. But these BGA chip carriers, too, have shortcomings such as a large size (due to the inability to produce fine-line interconnections, such as those on the IC chip itself). Additionally, conventional BGA chip carriers require the use of different manufacturing processes than are used for fabricating the IC chips. Furthermore, conventional BGA chip carriers provide no allowance for locating active components or electronic circuitry directly on the chip carrier to provide added functionality or testability for the IC chips. Finally, conventional BGA chip carriers can possibly aggravate the IC thermal management problem.

SUMMARY OF THE INVENTION

Succinctly stated, there are multiple objects of the present invention including:
1) reconfiguring a plurality of bond pads (I/O connections) from one or more integrated circuits (ICs) into a ball grid array output; 2) providing high-density re-routing of electrical conductor paths between bond pads on the IC or between several ICs; 3) providing a good thermal path for heat flow out of the integrated circuit; and 4) providing a platform to insert circuitry for testing, power conditioning, I/O reconfiguring, and signal integrity. The attainment of these objects will in turn create other advantages such as facilitating IC testing and electronic analysis of a bare IC die, or completed electronic assemblies.

The silicon ball-grid-array chip carrier of the present invention provides the interconnect re-routing structure on a crystalline semiconductor substrate, rather than relying plastic, ceramic, or other non-semiconductor materials on which it is difficult to apply fine-line electrical interconnections, and which can be thermally disadvantageous. Moreover, another advantage of the silicon ball-grid-array chip carrier of the present invention is that, by being formed from a silicon substrate, the same processes used for fabricating ICs can also be used for manufacturing the chip carrier, thereby reducing cost and increasing manufacturing compatibility.

Yet another advantage of the chip carrier of the present invention is that the silicon ball-grid-array chip carrier of the present invention provides a cap for protecting one or more IC chips. Still another advantage is that the silicon ball-grid-array chip carrier can serve as an additional heat sink or heat spreader, and in particular as a thermal stress absorber when an IC chip is to be interfaced with a material such as a glass epoxy printed circuit board, a ceramic package, or aluminum/copper plates which have high thermal coefficients of expansion and thereby create a thermal-mechanical load on electrical interconnections to the IC. (The highest stress area for failure on a solder-ball-mounted IC chip to such high thermal-coefficient-of-expansion materials occurs at the edges of the IC chip, especially at the diagonal corners.) Thus, still another advantage of the present invention is that re-routing of the IC die peripheral bond pads can alleviate the problem of thermal-mechanical stress and prevent potential failures of the electrical interconnections.

Accordingly, the present invention may be briefly summarized as the provision of a silicon substrate ball grid array chip carrier that is independent of the IC die and which includes fine-line metal traces or interconnections on a first surface of the silicon substrate, electrically-conductive vias through the substrate to interconnect the metal traces on the first surface to the opposite or second surface of the silicon substrate, and the provision of a solder ball in electrical contact with each via on the second surface of the silicon substrate to thereby reposition a plurality of IC peripheral bond pads (i.e. I/Os) to an area array. The provision of a silicon substrate also contributes to an improved thermal management of the IC. Additionally, the use of a silicon substrate allows the fabrication of a plurality of transistors directly on a surface of the chip carrier, and further allows the provision of fine-line electrical interconnections on the surface of the substrate for reconfiguring peripheral bond pads of the IC into a ball grid array. Finally, the use of a silicon substrate permits the provision of other devices directly on the chip carrier, including resistors, capacitors, inductors, and sensors. As a result, the silicon ball-grid-array chip carrier of the present invention can provide added functionality or testability to one or more ICs being packaged, including the provision of circuitry for electrical power conditioning, signal conditioning, I/O reconfiguration or environmental sensing (i.e. chip monitoring). The present invention can be used to form application-specific ICs (ASICs) by using conventional ICs and providing application-specific functionality on the silicon chip carrier.

The method or process of fabricating a silicon ball grid array chip carrier according to the present invention can be briefly summarized as comprising steps for forming patterned metal interconnects on a first surface of a silicon substrate, forming electrically-conducting vias through the silicon substrate terminating on one surface of the patterned metal interconnects, forming an electrically-insulating layer on sidewalls of the vias and on a second or opposite surface of the substrate, and forming a metallized layer on the sidewalls of the vias over the electrically-insulating layer and in electrical contact with the patterned metal interconnections. The process can further include a step for tacking a solder ball onto each metallized via. The process of the present invention can additionally include a step for bonding one or more ICs to the chip carrier so that each peripheral bond pad of the IC is electrically connected to one of the patterned metal interconnects and thereby electrically connected to one of the solder balls on the chip carrier.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention. In the drawings.

DETAILED DESCRIPTION OF THE INVENTION (BEST MODES FOR CARRYING OUT THE INVENTION)

Figure 1:
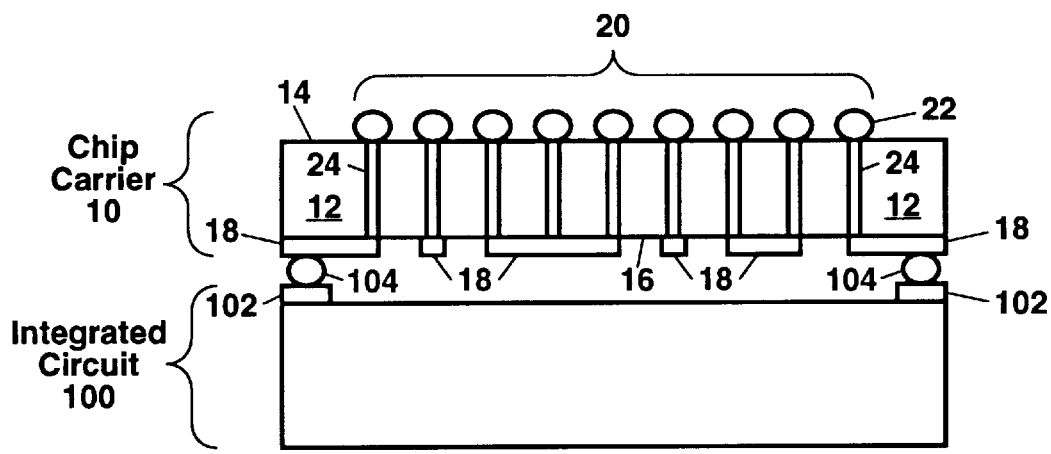
FIG. 1 is a diagrammatic side elevation view of the chip carrier in accordance with the present invention shown in conjunction with an integrated circuit chip.
Figure 2:
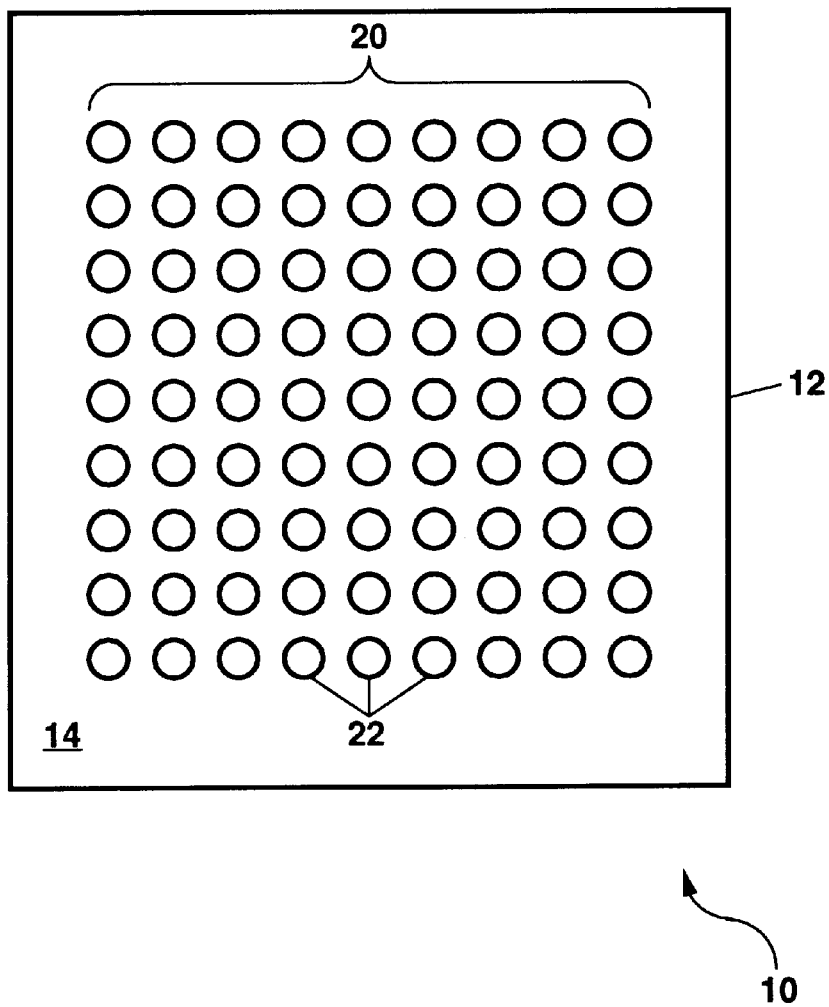
FIG. 2 is a top-view of the chip carrier in FIG. 1.

As seen in FIGS. 1 and 2, the silicon ball grid array chip carrier is indicated generally at 10 and is a simple device that mounts to one or more integrated circuits (ICs) 100. The chip carrier 10 includes a body 12 having a first or upper surface 14 and a second or lower surface 16 as shown in FIG. 1. Each IC 100 has a plurality of peripheral input/output (I/O) bond pads shown at 102. On the lower surface 16 of the carrier body 12 facing the surface of the IC 100 with the bond pads 102, there is provided patterned metal conductor lines 18 (also termed interconnects or traces) that interconnect the chip I/O bond pads 102 to a ball grid array 20. These conductor lines 18 may be formed as described below.

Figure 3:
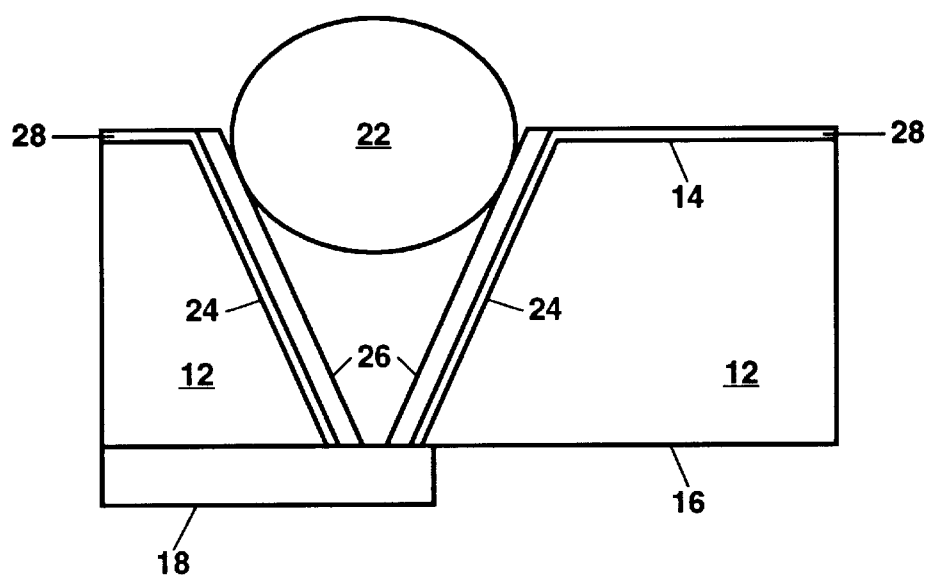
FIG. 3 is an enlarged partial side view of the chip carrier in FIG. 1.

As seen in FIG. 3, which represents an enlarged partial side view of the chip carrier 10, the conductor lines 18 are connected to selected solder balls 22 by means of a plurality of spaced electrically-conducting vias 24 also forming an array. The vias 24 have a conductive layer 26 deposited on generally sloping sidewalls of each via 24 to form an electrical connection between one of the conductor lines 18 and each solder ball 22. The conductor lines 18 and the conductive layer 26 are preferably electrically insulated from the silicon wafer body 12 by a thin insulating layer 28 formed on the body 12 and on the sidewalls of the vias 24.

In the preferred method and product, a plurality of chip carriers 10 are formed on a standard silicon wafer using, at least in part, standard IC processes so that the chip carriers 10 can be manufactured on a standard IC fabrication line. The use of an intrinsic silicon wafer (i.e. a 300 Ohms/cm wafer) can improve signal isolation between I/O pads 102, and can also improve the thermal conductivity of the chip carrier 10.

The metal conductor lines 18 on lower surface 16 of the carrier body 12 are formed by metal deposition and patterning and serve to interconnect each IC bond pad 102 to a particular solder ball 22 in a predetermined wiring arrangement. The metal conductor lines 18 are preferably formed with a gold metallization, such as titanium/gold (Ti/Au). Alternately, the metal conductor lines 18 can be formed from an aluminum or aluminum alloy metallization as is used in standard complimentary metal-oxide semiconductor (CMOS) IC processes. Several layers of metallization can be deposited and patterned with an insulating dielectric layer separating each pair of adjacent metallization layers to create standard impedance interconnections 18, to provide signal line shielding, to implement complex crossover interconnection geometries, or to off-load long interconnections from the integrated circuit 100 onto the chip carrier 10.

Since the chip carrier 10 is being fabricated on a CMOS IC process line using a silicon wafer, the present invention takes advantage of fine-line IC patterning capabilities to make electrical interconnects 18 that have lateral dimensions as small as about one micron wide. Additionally, standard IC processes can be used to fabricate a plurality of interconnected transistors on the lower surface 16 of the chip carrier 10. In addition to transistors, other components such as resistors, capacitors, inductors and sensors can be located on the lower surface 16 of the chip carrier 10 using standard IC processes, or hybrid assembly. The types of sensors that can be located on the chip carrier 10 include environmental sensors such as temperature sensors, pressure sensors, stress sensors, inertia or acceleration sensors, and chemical sensors. These sensors can further include microelectromechanical (MEM) sensors. In general, any type of component that can be fabricated by IC processes can be fabricated directly into the silicon chip carrier 10. Additionally, other types of components that are traditionally fabricated as hybrid devices (e.g. chip capacitors) can be attached to the silicon chip carrier 10 using hybrid assembly methods well known to the art.

The provision of transistors on the chip carrier 10 can make the chip carrier 10 into a "smart" carrier having signal processing, switching, or sensing capabilities. Capabilities which optionally can be provided on the chip carrier 10 include testability circuits or features, such as boundary-scan cells and built-in test structures; signal conditioning circuitry, such as buffer amplifiers and filters; power conditioning circuitry, such as voltage control and spike suppression circuits; and a reconfiguration capability, such as switches (e.g. a programmable logic array) to block and/or open selected I/Os of the IC 100 in response to external programming provided through some of the vias 24. The implementation of transistors on the chip carrier 10 will, in general, depend upon the cost trade-offs between the creation of transistors on the chip carrier 10 or on the IC 100. Additionally, a "smart" chip carrier 10 can be used to increase the functionality or testability of conventional ICs.

The silicon wafer body 12 can be from about 0.04 and 0.004 inches thick (i.e. between 1 millimeter and 100 microns), for example. Thinning the silicon wafer by polishing can be advantageous to allow easier fabrication of the through-holes or vias 24. Additionally, a thinned body 12 reduces an overall thickness of the combined chip carrier 10 and IC 100.

On the lower surface 16 of the carrier body 12, photolithography and etching or lift-off processes can be used to define the patterned metal conductor lines 18 with predetermined widths or feature sizes as small as one micron. An etching step for forming the vias 24 through the silicon body 12 can be performed by using a wet chemical etchant (e.g. potassium hydroxide), or by using dry etching (e.g. an isotropic plasma). Selective etching can be terminated at the metal conductor lines 18 on the surface 16 of the carrier body 12. Vias 24, with diameters of generally about 1 to 3 thousandths of an inch (i.e. about 25–75 microns), can also be formed by laser drilling (e.g. with a focused beam from a Nd:YAG laser). The depth of laser-drilled vias 24 can be up to about 40 thousandths of an inch (i.e. 1 millimeter).

After forming the vias 24, the surface 16 of the silicon wafer body 12 and the sidewalls of the vias 24 can then be anodized and oxidized in an electrolytic cell or by exposure to a plasma to create a thin electrically-insulating layer 28 as shown in FIG. 3. In addition to formation of the insulating layer 28 in an electrolytic cell or by exposure to a plasma, the insulating layer 28 can be formed through other processes including sol-gel deposition, electrophoretic deposition, photo resist application and patterning, or vacuum deposition. The insulating layer 28, which serves to electrically isolate each via 24 from other of the vias 24 and from the body 12, can comprise dielectric materials such as silicon dioxide, glass, silicon nitride or polyimide. The insulating layer 28 is typically up to a few microns thick (e.g. 1–10 microns thick), and is preferably formed substantially free of any internal stress.

The metallized layer 26 in each via 24, as shown in FIG. 3, can be deposited on the sidewalls of the via 24 by use of a mask or stencil that masks off the upper surface 14 between each via 24. The metallized layer 26 can then be deposited by evaporation or sputtering. Alternately, a layer of a conductive metal paste can be screened onto the upper surface 14 filling the vias 24 and fired to form the metallized layer 26.

The solder balls 22 can be hard conductive solder balls, which are preferred for certain applications. The solder balls 22 are positioned on the upper surface 14 of the carrier body 12, for example, by mechanically shaking the carrier body 12 so that a plurality of loose solder balls 22 placed on the upper surface 14 will move around until they become lodged in the vias 24 as shown in FIG. 3. The solder balls 22 located within each via 24 can be thermally tacked into place on the upper surface 14 of chip carrier body 12. If the IC 100 and the chip carrier 10 have not previously been cut from the silicon wafers from which they were formed, that step can be performed.

The IC 100 and the chip carrier 10 can be attached, for example, through the use of gold micro balls 104 which are placed on selected conductor lines 18 that are to be electrically connected to the IC bond pads 102, or on the IC bond pads 102 themselves. The IC 100 and chip carrier 10 can then be bonded together by a thermocompression bonding process. The IC 100 and the chip carrier 10 can be protected by a deposited gel or epoxy encapsulant thereby providing environmental and mechanical protection, if needed.

As indicated above, by the use of silicon as the body 12 of the chip carrier 10, various levels of complexity can be implemented in the chip carrier 10. For example, the provision of fine-line metal interconnects 18 between the I/Os of the IC 100 and the ball grid array 20 greatly simplifies testability of the IC 100 since the spacing between the solder balls 22 in the ball grid array can be much larger than the spacing of the IC peripheral bond pads 102. In some embodiments of the present invention, the chip carrier 10 can include built-in self-testing circuitry for testing the functionality of the IC 100. In other embodiments of the present invention, electronic circuitry can be formed on the lower surface 16 of the chip carrier 10 to provide for power conditioning (e.g. smoothing capacitors, voltage conversion circuitry, or voltage pegging circuitry), or signal conditioning (e.g. using filtering circuitry), or amplification of signals from the IC 100. In yet other embodiments of the present invention, the chip carrier 10 can be provided with one or more sensors formed thereon to detect and characterize parameters of the IC 100, including heating (e.g. temperature mapping), noise, stress or data transfer error rate. In still other embodiments of the present invention, the chip carrier 10 can include a plurality of electrically reconfigurable switches that can be used to program the I/O pads of the IC 100, thereby permitting a programmable reconfiguration of electrical interconnections to and from the IC 100. Using the teaching of the present invention, application-specific ICs (ASICs) can be formed using conventional ICs and providing application-specific circuitry on the silicon chip carrier 10.

The chip carrier 10 formed according to the present invention has applications for testing an IC 100, or for providing enhanced capabilities for an IC 100. The chip carrier 10 allows the use of standard commercial ICs 100 to form a custom or high-performance circuit assembly. The chip carrier 10 of the present invention provides an inexpensive way to achieve a substantial modification to a conventional IC 100 without the need for changes to the original IC product.

Although the present invention has been described in detail with particular reference to preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. A chip carrier for use with one or more integrated circuits (ICs) having a plurality of peripheral bond pads, comprising:
   a) a silicon substrate;
   b) a plurality of electrically conducting vias formed through the substrate in an array;
   c) patterned metal interconnections formed on the lower substrate surface to provide an electrical interconnection between the IC bond pads and the vias wherein the chip carrier is adapted to be mechanically and electrically bonded to each IC so that the peripheral bond pads of each IC are electrically reconfigured.

2. The chip carrier of claim 1 further including a solder ball in electrical contact with each via.

3. The chip carrier of claim 1 wherein the silicon substrate is formed from intrinsic silicon.

4. The chip carrier of claim 1 wherein the patterned metal interconnections are formed from metals selected from the group consisting of gold, titanium, aluminum, and alloys thereof.

5. The chip carrier of claim 1 further comprising components formed on the lower surface of the substrate.

6. The chip carrier of claim 5 wherein the components are selected from the group consisting of transistors, resistors, capacitors, inductors and sensors.

7. The chip carrier of claim 5 wherein the components and patterned metal interconnections form a signal conditioning circuit selected from the group consisting of buffer amplifiers and filters.

8. The chip carrier of claim 5 wherein the components and patterned metal interconnections form circuitry for testing the IC.

9. The chip carrier of claim 5 wherein the components and patterned metal interconnections comprise means for switching input/output (I/O) signals from the IC.

10. The chip carrier of claim 1 wherein the silicon substrate has a thickness in the range of 0.04 to 0.004 inches.

11. The chip carrier of claim 1 wherein the chip carrier and the IC are protected by an encapsulant.

12. The chip carrier of claim 1 wherein each via includes a deposited metallization on sidewalls of the via.

13. The chip carrier of claim 1 wherein each via is electrically insulated from the substrate by a thin insulating layer.

14. The chip carrier of claim 13 wherein the insulating layer comprises an insulating material selected from the group consisting of silicon dioxide, glass, silicon nitride, and polyimide.

15. The chip carrier of claim 13 wherein the insulating layer has a thickness in the range of 1–10 microns.

16. A ball-grid array device attached to at least one integrated circuit (IC) having a plurality of peripheral bond pads, comprising:
   a) a silicon substrate;
   b) a plurality of electrically conducting vias formed through the silicon substrate;
   c) patterned metal interconnections formed on a first surface of the silicon substrate and insulated therefrom to provide an electrical interconnection between the IC bond pads and the vias;
   d) a solder ball attached to each via proximate to a second surface of the silicon substrate; and
   e) means for attaching each bond pad of the IC to the patterned metal interconnections.

17. The ball-grid array device of claim 16 wherein a plurality of transistors are formed on the first surface of the silicon substrate and electrically connected to the patterned metal interconnections.

18. The ball-grid array device of claim 16 wherein at least one sensor is formed on the first surface of the silicon substrate and electrically connected to the patterned metal interconnections.

* * * * *